United States Patent
Wilson et al.

(10) Patent No.: US 7,839,965 B2
(45) Date of Patent: Nov. 23, 2010

(54) HIGH-SPEED SERIAL DATA LINK WITH SINGLE PRECISION CLOCK SOURCE

(75) Inventors: William B. Wilson, Macungie, PA (US); Kenneth Wade Paist, Spring City, PA (US)

(73) Assignee: Agere Systems Inc., Allentown, PA (US)

( * ) Notice: Subject to any disclaimer, the term of this patent is extended or adjusted under 35 U.S.C. 154(b) by 1035 days.

(21) Appl. No.: 11/602,275

(22) Filed: Nov. 21, 2006

(65) Prior Publication Data
US 2008/0118015 A1     May 22, 2008

(51) Int. Cl.
*H04L 7/00* (2006.01)
(52) U.S. Cl. .................. 375/358; 375/219; 375/356; 375/370
(58) Field of Classification Search ............ 375/219, 375/356, 358, 370
See application file for complete search history.

(56) References Cited

U.S. PATENT DOCUMENTS

| | | | |
|---|---|---|---|
| 3,636,545 A * | 1/1972 | Boyd et al. ............ | 702/147 |
| 6,570,452 B2 | 5/2003 | Sridharan | |
| 7,263,153 B2 * | 8/2007 | Sutioso et al. ............ | 375/373 |
| 7,295,644 B1 * | 11/2007 | Wu et al. ............... | 375/375 |
| 7,398,341 B1 * | 7/2008 | Gaither ................. | 710/69 |
| 2002/0115420 A1 * | 8/2002 | Cheng ................. | 455/333 |
| 2006/0055468 A1 * | 3/2006 | Hallivuori et al. ........... | 331/16 |

* cited by examiner

*Primary Examiner*—Chieh M Fan
*Assistant Examiner*—Siu M Lee

(57) ABSTRACT

A clock generator is provided for a transmitter in a transceiver adapted to communicate data over a serial data link. The transceiver includes a clock data recovery circuit recovers a receive clock signal and outputs a reference clock signal. The clock generator includes a local clock, a frequency difference detector, and a fractional-N frequency synthesizer. The local clock outputs a local clock signal. The frequency difference detector outputs a fractional frequency difference signal based on a frequency difference between the local clock signal and the reference clock signal. The fractional-N frequency synthesizer outputs a transmit clock signal having a same frequency as the recovered receive clock signal.

19 Claims, 2 Drawing Sheets

400

500

# HIGH-SPEED SERIAL DATA LINK WITH SINGLE PRECISION CLOCK SOURCE

BACKGROUND AND SUMMARY

High-speed serial data links are used in many applications. An example of such a data link is described in the "Serial ATA Revision 2.5 Specification," 27 Oct. 2005, by the Serial ATA International Organization, the entirety of which is hereby incorporated by reference herein for all purposes as if fully set forth herein (ATA is an acronym for Advanced Technology Attachment, a disk drive interface standard based on the IBM Personal Computer Industry Standard Architecture (ISA) 16-bit bus but also used on other personal computers).

In some applications of high-speed serial data links, such as a serial ATA (SATA) full duplex high-speed serial data link, the receiver at each end of the data link recovers the receive clock from the received data signal.

FIG. 1 illustrates an example of a system 100 employing a high-speed serial data link where the receivers at each end of the data link recover the receive clock from the received data signal. System 100 includes a first (host) transceiver 110, a second (device) transceiver 150, a first local clock 120, and a second local clock 170. First transceiver 110 includes a transmitter 112 and a receiver 115, while second transceiver 150 includes a transmitter 152 and a receiver 155.

First local clock 120 supplies a transmit clock to transmitter 112 at the first (host) end, and second local clock 170 supplies a transmit clock to transmitter 152 at the second (device) end of the link.

In many applications of a high-speed serial data link, such as a SATA data link, a precision clock signal is required at each end of the data link. In systems with a high-speed serial data link requiring a precision clock signal at each end, a crystal oscillator can be used at each end of the data link to generate the required precision local clock signal.

However, a crystal oscillator adds cost to the transceiver at each end, and it would be desirable to replace the crystal oscillator where possible with a cheaper ceramic resonator.

Accordingly, if the transmitter at one end (e.g., the device end) of the data link could use the recovered clock that was generated at the far end (e.g., host end) of the data link, then the device could generate its transmit clock using the much cheaper ceramic resonator, instead of a crystal source.

FIG. 2 illustrates an example of a system 200 employing a high-speed serial data link that utilizes a recovered receive clock from a received data signal to produce the transmit clock at one end of the data link. System 200 includes a first (host) transceiver 210, a second (device) transceiver 250, a first local clock 220, and a second local clock 270. First transceiver 210 includes a transmitter 212 and a receiver 215, while second transceiver 250 includes a transmitter 252 and a receiver 255.

First local clock 220 supplies a transmit clock to transmitter 212 at the far end (host end of the data link. Meanwhile, receiver 255 recovers a receive clock signal from the received data signal, and provides the recovered receive clock to transmitter 252 as a transmit clock 270.

Receiver 255 can employ an analog tracking receiver to recover the receive clock to be employed in generating the transmit clock.

However, such an approach has some disadvantages. Specifically, in many applications such as a SATA high-speed serial data link, the transmit clock has more stringent requirements than are required for the recovered receive clock. More specifically, there are requirements that limit the amount of jitter that is permitted on the transmit clock. In that case, the above-described approach suffers from the fact that the system level transmit clock jitter requirements are passed down to the clock data recovery (CDR) circuit in the receiver. This in turn leads to a more complex and power-hungry design than would otherwise be necessary. For example, the oscillator in the receiver CDR typically must use more power to get the random phase noise down to a level that is acceptable for the transmit clock. Furthermore, digital CDR circuits (which generally have lower power requirements and occupy less area than analog circuits) generally produce a clock signal whose jitter is too great for applications such as the SATA specification described above. A hybrid analog/digital CDR may be employed, but again this comes at the expense of increased power consumption and increased area.

Therefore, it would be desirable to provide a high-speed serial data link which operates with a single precision clock source. It would also be desirable to provide a clock generating circuit for a high-speed serial data link that can operate without a crystal source.

In accordance with an example embodiment, a clock generator for a transmitter in a transceiver is adapted to communicate data over a serial data link. The transceiver includes a clock data recovery circuit adapted to recover a receive clock and to output a reference clock signal derived from the recovered receive clock. The clock generator comprises: a local clock, a frequency difference detector, and a fractional-N frequency synthesizer. The local clock is adapted to output a local clock signal. The frequency difference detector is adapted to receive the local clock signal and the reference clock signal output from the clock data recovery circuit, and to output a fractional frequency difference signal based on a frequency difference between the local clock signal and the reference clock signal. The fractional-N frequency synthesizer is adapted to receive the local clock signal and the fractional frequency difference signal and to output a transmit clock signal having a same frequency as the recovered receive clock signal.

In accordance with another example embodiment, a transceiver is adapted to communicate data over a serial data link. The transceiver comprises a transmitter having a transmitter clock input; a receiver including a clock data recovery circuit having a reference clock output; and a clock generator. The clock generator comprises: a local clock, a frequency difference detector, and a fractional-N frequency synthesizer. The local clock has a local clock output. The frequency difference detector includes: a first clock input connected to the reference clock output of the clock data recovery circuit, a second clock input connected to the local clock output, and a frequency difference output. The fractional-N frequency synthesizer includes a reference clock input connected to the local clock output, a frequency offset input connected to the frequency difference output of the frequency difference detector, and a transmit clock output connected to the transmitter clock input.

In accordance with yet another example embodiment, a method is provided for generating a transmit clock signal for a transceiver communicating over a high-speed data link. The method comprises: comparing a local clock signal with a reference clock signal derived from a recovered receive clock signal, and determining a frequency difference between the local clock signal and the reference clock signal; and using the local clock signal and the frequency difference to synthesize the transmit clock signal in a fractional-N frequency synthesizer, where the fractional-N synthesizer determines a frequency of the transmit clock signal as an integer multiple of a frequency of the local clock signal, plus a fractional multiple of the frequency of the local clock signal, where the fractional multiple is determined by the frequency difference between the local clock signal and the reference clock signal.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

In the description to follow, when it is said that two or more components or points are connected to each other, it should be understood that does not preclude the possibility of the existence of intervening elements or components. In contrast, when it is said that two or more components or points are directly connected to each other, it should be understood that the two components or points are connected without any intervening components or circuits that significantly affect a signal passed across the connection. However a conductive contact, wire, or line which does not present substantial capacitance, inductance, or resistance at frequencies of interest may be used to directly connect the two or more components or points.

Figure 1:
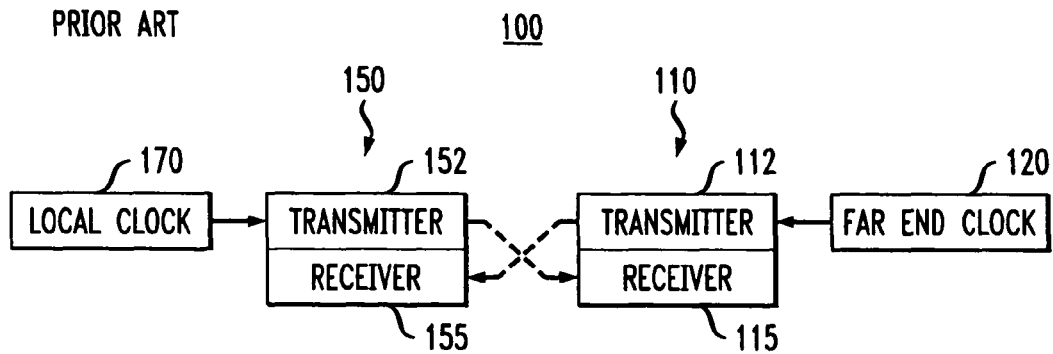
FIG. 1 illustrates a system employing a high-speed serial data link where the receivers at each end of the data link recover their receive clock from the received data signal.
Figure 2:
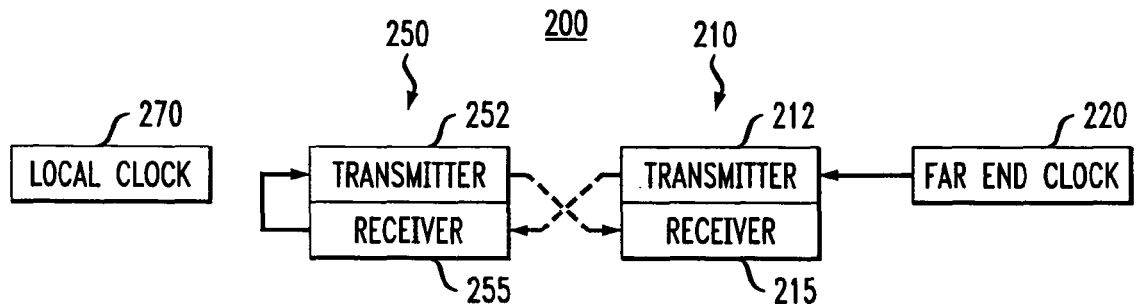
FIG. 2 illustrates a system employing a high-speed serial data link that utilizes a recovered receive clock from a received data signal to produce the transmit clock at one end of the data link
Figure 3:
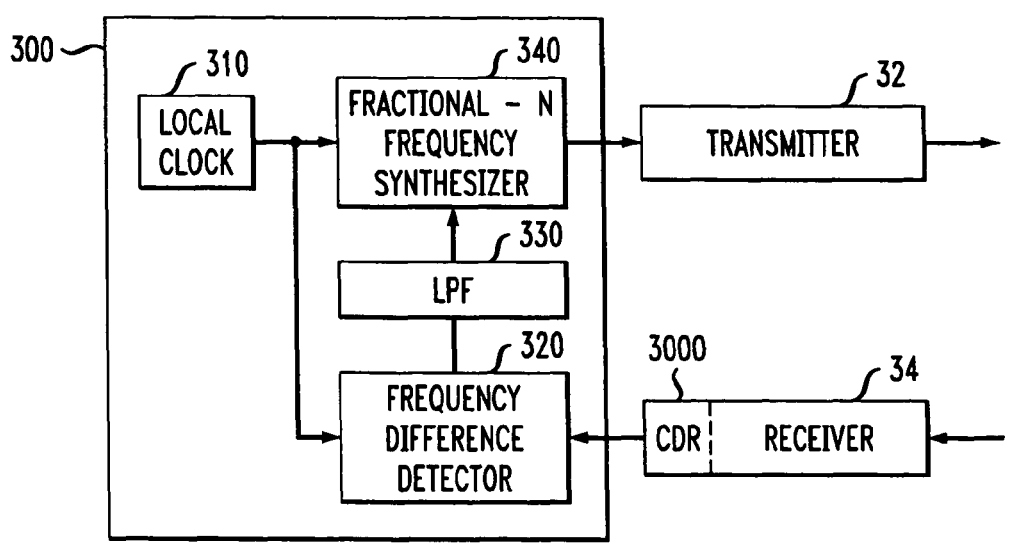
FIG. 3 is a functional block diagram of one embodiment of a transceiver for a high-speed serial data link including a clock generator.

FIG. 3 is a functional block diagram of one embodiment of a transceiver 30, including a transmitter 32, a receiver 34, and clock generator 300 for a high-speed serial data link. Receiver 34 includes a clock data recovery (CDR) circuit 3000 having a reference clock output. Clock generator 300 includes a local clock 310, frequency difference detector 320, a low-pass filter 330, and a fractional-N frequency synthesizer 340.

As a functional block diagram, it should be understood that FIG. 3 does not show various elements such a power supplies, frequency multipliers or dividers that are not essential to an understanding of its relevant features and operating principles. For example, in an actual embodiment one or more frequency multipliers or frequency dividers may be present between local clock 310 and frequency difference detector 320 and/or fractional-N frequency synthesizer 340, and/or between receiver CDR 3000 and frequency difference detector 320. On a functional level, such components could be considered as being subsumed within local clock 310, frequency difference detector 320, and/or fractional-N frequency synthesizer 340, without any loss of generality.

Beneficially, local clock 310 is a ceramic resonator clock, rather than a precision clock source, such as a crystal oscillator. Also beneficially, frequency difference detector 320 is a rotational frequency detector. Alternatively, frequency difference detector 320 may comprise a mixer circuit.

Clock generator 300 operates generally as follows. Beneficially, in operation transceiver 30 is connected to a second transceiver at a far end of a full duplex high-speed serial data link. In that case, in one exemplary embodiment, transceiver 30 may be a device transceiver and the second transceiver at the far end of the data link may be a host transceiver having a precision clock source available for transmitting a data signal. In one example embodiment, the precision clock signal at the second transceiver is generated using a crystal clock source with high accuracy.

Receiver 34 receives the data signal from the high-speed serial data link. At this time, receiver CDR 3000 recovers a receive clock from the data signal, and outputs a reference clock signal derived from the recovered receive clock. Beneficially, this reference clock signal enjoys the frequency accuracy of the precision clock signal of the second transceiver. For example, the reference clock signal may be the recovered receive clock itself, or it may be the output of a frequency divider circuit that receives the recovered receive clock, etc. However, beneficially, the reference clock signal enjoys the same frequency accuracy and stability as the recovered receive clock, and therefore the same frequency accuracy and stability as the precision clock signal of the second transceiver. The reference clock signal is coupled to a first clock input of frequency difference detector 320.

Meanwhile, local clock 310 outputs a local clock signal, which is provided to a second clock input of frequency difference detector 320 and a reference clock input of fractional-N frequency synthesizer 340.

Frequency difference detector 320 detects a frequency difference between the reference clock signal and the local clock signal. Of course it should be understood that one or both of the reference clock signal and the local clock signal may be multiplied or divided in frequency before the comparison, as needed, depending upon the output frequency of local clock 310 and the frequency of the reference clock signal. Frequency difference detector 320 outputs a fractional frequency difference signal to a frequency offset input of fractional-N frequency synthesizer 340, based on a frequency difference between the local clock signal and the reference clock signal. The use of the fractional frequency difference signal will be explained in further detail below.

Fractional-N frequency synthesizer 340 receives the local clock signal and the fractional frequency difference signal and generates therefrom a transmit clock signal which it outputs from a transmit clock output to transmitter 32. Beneficially, the transmit clock signal has a same frequency as the recovered receive clock signal.

Beneficially, fractional-N frequency synthesizer 340 determines a frequency of the transmitter clock signal as an integer multiple of the frequency of the local clock signal, plus a fractional multiple of the frequency of the local clock signal, where the fractional multiple is determined by the frequency difference between the local clock signal and the reference clock signal. This can be better understood by considering an exemplary embodiment where: (1) the frequency of the local clock signal is 1 MHz; (2) the frequency of the recovered receive clock signal is 3 GHz+3 MHz; and (3) the desired frequency of the transmit clock signal is also 3 GHz+3 MHz. In that case, then the fractional frequency difference between the local clock signal and the reference clock signal may be obtained by: (a) dividing the frequency of the recovered receive clock frequency by 3000; (b) subtracting the frequency of local clock signal from the divided frequency of the recovered receive clock signal; and (c) dividing the result from (b) by the frequency of the local clock signal. In that case, it can be seen that the fractional frequency difference is 0.001. Then, to determine the frequency of the transmit clock signal, fractional-N frequency synthesizer 340 may: (i) multiply the frequency of the local clock signal by an integer value of 3000 to get 3 GHz; (ii) multiply the frequency of the local clock signal by the fractional frequency difference of 0.001 to get 3 MHz; and (iii) add the result of (a) to the result of (b) to get the frequency of the transmit clock signal as 3 GHz+3 MHz. Of course the above is merely exemplary for explanation of the general principles involved, and the implementation details may be arranged in a variety of ways.

Figure 4:
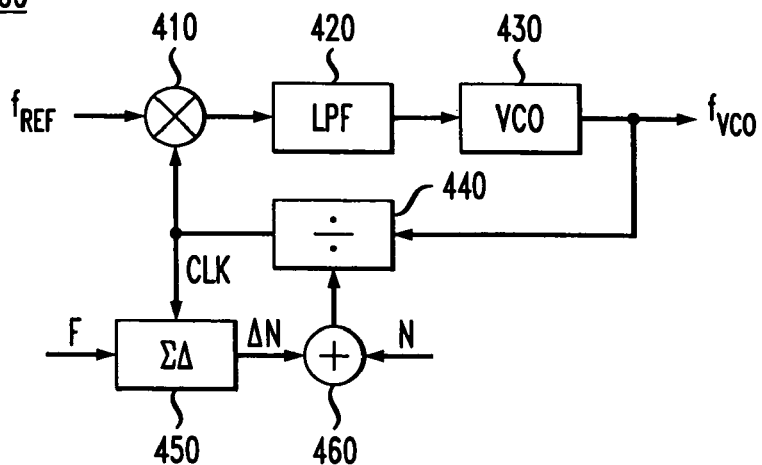
FIG. 4 is a functional block diagram of an exemplary fractional-N frequency synthesizer.

FIG. 4 is a functional block diagram of an exemplary fractional-N frequency synthesizer 400. Fractional-N frequency synthesizer 400 includes a phase/frequency detector 410, a loop filter 420, a voltage control oscillator (VCO) 430, a programmable frequency divider 440, a sigma-delta modulator 450, and an adder 460. In one embodiment, VCO 430 is a ring oscillator.

VCO 430 produces a transmit clock signal having a frequency that changes in response to an applied voltage received from loop filter 420. The transmit clock signal is provided to programmable divider 440 which divides the frequency of the transmit clock signal and provides the divided-down clock signal to phase/frequency detector 410. Phase/frequency detector 410 compares the frequency and phase of the divided-down clock signal to the local clock signal, and generates an output signal representing the difference. Loop filter 420 (e.g., a low pass filter) operates to increase the stability of the feedback system, and to minimize the phase noise of the transmit clock signal output from VCO 430.

Delta-sigma modulator 450 receives the fractional frequency difference signal and generates a fractional divider value ΔN for programmable frequency divider. As is well-known to those skilled in the art of fractional-N frequency synthesizers, in order to eliminate a "frequency spur" or sideband in the spectrum of delta-sigma modulator 450 operates to produce an output ΔN as a pseudo-random sequence having an average value of ΔNAVG. The fractional frequency divider value is added to an integer divider value N in adder 460 to produce a divider value (N+ΔN) to be used by programmable frequency divider 440.

In the example described above with respect to FIG. 3, N may be 3000, and $\Delta N_{AVG}$ may be 0.001. In that case, it can be seen that (N+ΔN) is 3000.001 and if the frequency of the local clock signal is 1 MHz, then the frequency of the transmit clock signal output by VCO 530 is 3 GHz+3 MHz, as desired in the given example.

Turning back again to FIG. 3, in one embodiment both the receive clock signal and the transmit clock signal are spread spectrum clock signals. In that case, in general receiver CDR 3000 will track the spread spectrum receive clock signal and pass this on to frequency difference detector 320. Accordingly, low pass filter 330 is needed to insure that the spread spectrum modulation of the receive clock is not passed on to fractional-N frequency synthesizer 340. Indeed, beneficially the fractional frequency difference signal output by frequency difference detector 320 is a DC voltage. In that case, the DC voltage can be determined once during a start-up process for transceiver 30, and that DC voltage can be used until transceiver 30 is turned-off. Alternatively, as shown in the embodiment of FIG. 3, the output of frequency difference detector 320 can be low pass filtered by low pass filter 330 to produce the DC value.

Figure 5:
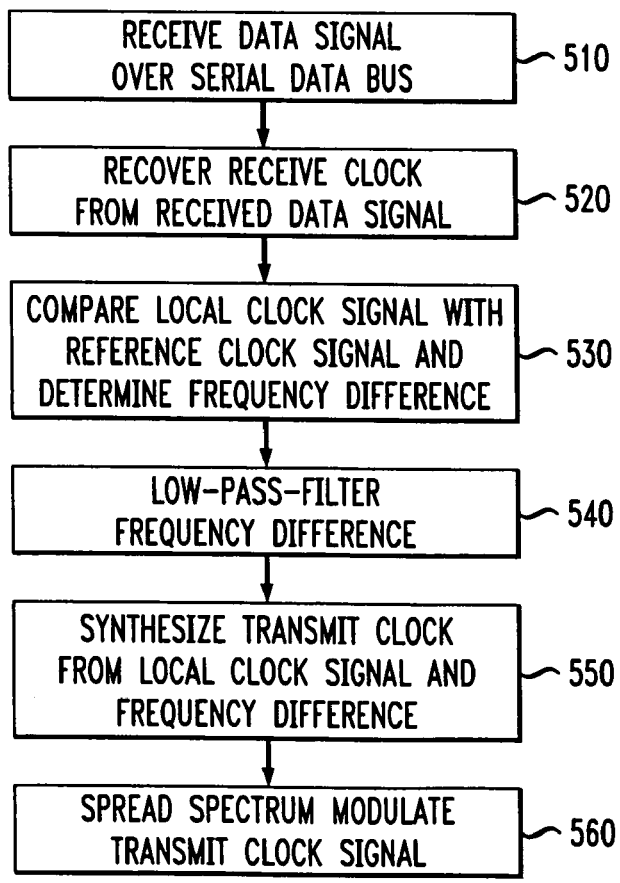
FIG. 5 is a flowchart of a method of generating a transmit clock signal in a transceiver for a high-speed serial data link.

FIG. 5 is a flowchart of a method 500 of generating a transmit clock signal in a transceiver for a high-speed serial data link. In a first step 510, a receiver receives a data signal over a serial data bus. In a next step 520, the receive clock is recovered from the received data signal. In a next step 530, the local clock signal is compared with a reference clock signal derived from a recovered receive clock, and a frequency difference is determined between the local clock signal and the reference clock signal.

In a step 540, the frequency difference is low-pass filtered.

Then, in a step 550, the local clock signal and the low-pass-filtered frequency difference are used to synthesize the transmitter clock signal in a fractional-N frequency synthesizer. Here, the fractional-N synthesizer determines a frequency of the transmitter clock signal as an integer multiple of a frequency of the local clock signal, plus a fractional multiple of the frequency of the local clock signal, where the fractional multiple is determined by the frequency difference.

Finally, in a step 560 the transmitter clock signal is spread spectrum modulated.

One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the scope of the appended claims.

We claim:

1. A clock generator for a transmitter in a transceiver adapted to communicate data over a serial data link, the transceiver including a clock data recovery circuit adapted to recover a receive clock and to output a reference clock signal derived from the recovered receive clock, the clock generator comprising:

a local clock adapted to output a local clock signal;

a frequency difference detector adapted to i) receive the local clock signal and the reference clock signal output from the clock data recovery circuit and ii) provide a fractional frequency difference signal based on a frequency difference between the local clock signal and the reference clock signal, wherein the reference clock signal is a fraction of the recovered receive clock; and a fractional-N frequency synthesizer adapted to generate i) an integer multiple of the local clock signal, ii) a fractional multiple of the local clock signal based on the fractional frequency difference signal and iii) combine the integer multiple and the fractional multiple to provide a transmit clock signal having a same frequency as the recovered receive clock signal.

2. The clock generator of claim 1, further comprising a low pass filter adapted to filter the fractional frequency difference signal output by the frequency difference detector.

3. The clock generator of claim 1, wherein the frequency difference detector is adapted to output the fractional frequency difference signal as a DC voltage corresponding to a frequency difference between the local clock signal and the reference clock signal.

4. The clock generator of claim 1, wherein the frequency difference detector includes one of a rotational frequency detector and a mixer.

5. The clock generator of claim 1, wherein the fractional-N frequency synthesizer is adapted to output the transmit clock signal as a spread spectrum clock signal.

6. The clock generator of claim 1, wherein the local clock comprises a ceramic resonator.

7. The clock generator of claim 1, wherein the transceiver is a transceiver for a Serial ATA device.

8. A transceiver adapted to communicate data over a serial data link, the transceiver comprising:
   a transmitter having a transmitter clock input;
   a receiver including a clock data recovery circuit having a reference clock output, wherein the reference clock output is a fraction of a receive clock recovered by the clock data recovery circuit; and a clock generator, comprising:
   a local clock having a local clock output;
   a frequency difference detector having, a first clock input connected to the reference clock output of the clock data recovery circuit, a second clock input connected to the local clock output, and a frequency difference output; and
   a fractional-N frequency synthesizer having a reference clock input connected to the local clock output, a frequency offset input connected to the frequency difference output of the frequency difference detector, and a transmit clock output connected to the transmitter clock input,
   wherein the fractional-N frequency synthesizer determines a frequency of the transmit clock as an integer multiple of a frequency of the local clock output, plus a fractional multiple of the frequency of the local clock output, where the fractional multiple is determined by the frequency difference output.

9. The transceiver of claim 8, further comprising a low pass filter connected between the frequency difference output of the frequency difference detector and the frequency offset input of the fractional-N frequency synthesizer.

10. The transceiver of claim 8, wherein the frequency difference detector is adapted to output the fractional frequency difference signal as a DC voltage corresponding to a frequency difference between the local clock signal and the reference clock signal.

11. The transceiver of claim 8, wherein the frequency difference detector includes one of a rotational frequency detector and a mixer.

12. The transceiver of claim 8, wherein the fractional-N frequency synthesizer is adapted to output the transmit clock signal as a spread spectrum clock signal.

13. The transceiver of claim 8, wherein the local clock comprises a ceramic resonator.

14. The transceiver of claim 8, where the serial data link is a SATA data link.

15. A method of generating a transmitter clock signal for a transceiver communicating over a high-speed data link, the method comprising:
   comparing a local clock signal with a reference clock signal derived from a recovered receive clock signal, and determining a frequency difference between the local clock signal and the reference clock signal, wherein the reference clock signal is a fraction of the recovered receive clock signal; and
   using the local clock signal and the frequency difference to synthesize the transmitter clock signal in a fractional-N frequency synthesizer, where the fractional-N synthesizer determines a frequency of the transmitter clock signal as an integer multiple of a frequency of the local clock signal, plus a fractional multiple of the frequency of the local clock signal, where the fractional multiple is determined by the frequency difference.

16. The method of claim 15, further comprising recovering the receive clock signal from a received data signal.

17. The method of claim 15, further comprising low-pass filtering the frequency difference before using it to synthesize the transmitter clock signal in the fractional-N frequency synthesizer.

18. The method of claim 15, further comprising spread spectrum modulating the transmitter clock signal.

19. The method of claim 15, further comprising generating the local clock signal with a ceramic resonator.

* * * * *